United States Patent [19]

Kaylor

[11] Patent Number: 5,712,581
[45] Date of Patent: Jan. 27, 1998

[54] FULL DIFFERENTIAL DATA QUALIFICATION CIRCUIT FOR SENSING A LOGIC STATE

[75] Inventor: Scott Alan Kaylor, Gilbert, Ariz.

[73] Assignee: Motorola, Inc., Schaumburg, Ill.

[21] Appl. No.: 576,270

[22] Filed: Dec. 21, 1995

Related U.S. Application Data

[63] Continuation of Ser. No. 100,228, Aug. 2, 1993, abandoned.

[51] Int. Cl.[6] .......................... H03K 5/153; H03K 5/24
[52] U.S. Cl. .............................. 327/74; 326/21; 327/67
[58] Field of Search .................... 307/354, 355, 307/359, 356, 475; 326/21, 35; 327/63, 65, 71, 74, 77, 67

[56] References Cited

U.S. PATENT DOCUMENTS

| | | | |
|---|---|---|---|
| 4,581,545 | 4/1986 | Beale | 307/359 |
| 4,873,702 | 10/1989 | Chiu | 307/359 |
| 4,926,068 | 5/1990 | Fujita | 307/359 |
| 5,155,386 | 10/1992 | Abdi | 307/359 |
| 5,166,550 | 11/1992 | Matsubara | 307/359 |

Primary Examiner—Edward P. Westin
Assistant Examiner—Benjamin D. Driscoll
Attorney, Agent, or Firm—Miriam Jackson; Gary W. Hoshizaki; Sharon K. Coleman

[57] ABSTRACT

A data qualification circuit (11) comprises a comparator (28), a first threshold circuit (33), and a second threshold circuit (41). A differential input signal is applied to the data qualification circuit (11). A first threshold circuit (33) is enabled by a zero logic state at the output of comparator (28). The first threshold circuit (33) sets a one logic state threshold voltage which the differential input signal must overcome for the comparator (28) to generate a one logic state. A second threshold circuit (41) is enabled by a zero logic state at the output of comparator (28). The second threshold circuit (41) sets a zero logic state threshold voltage which the differential input signal must overcome for the comparator (28) to generate a zero logic state.

20 Claims, 2 Drawing Sheets

FULL DIFFERENTIAL DATA QUALIFICATION CIRCUIT FOR SENSING A LOGIC STATE

This application is a continuation of prior application Ser. No. 08/100,228, filed Aug. 2, 1993, abandoned.

BACKGROUND OF THE INVENTION

This invention relates, in general, to pulse detection of magnetic recording systems, and more particularly to data qualification circuits for asymmetrical signals.

The storage of digital information in a magnetic format is well known. There are many types of magnetic storage systems on the market. One such magnetic storage system is a magnetic disk drive system utilizing magneto resistive heads for recording and reading data. Magneto resistive heads generate a change in resistance corresponding to a change in magnetic information stored on a magnetic media such as a disk or platter. Magneto resistive heads produce read signal amplitudes that are less sensitive to rotating disk speed than other head types (example—thin film heads).

In general, a magneto resistive head when reading magnetic information stored on the magnetic media will generate a positive resistance change for a north to south flux reversal and a negative resistance change for a south to north flux reversal. The problem with the magneto resistive head is that the output signal generated is asymmetrical. In other words, the positive signals produced by the magneto resistive head are a different voltage magnitude than the negative signals. This asymmetry poses severe problems in sensing information stored on the magnetic media due to the possibility of false sensing. Data is never fully erased from the magnetic media, traces of previously erased data is sensed by the magneto resistive head and produces a positive voltage magnitude albeit smaller than a legitimate data bit. Also, the data on the magnetic media such as a disk is stored in tracks, the magneto resistive head is sensitive enough to pick up data from an adjacent track which is similar to crosstalk on a communication line. A single threshold is not adequate for sensing both the positive and negative signals. For example, assume the positive signal has twice the voltage magnitude of the negative signal. Choosing a low threshold voltage that insures sensing of the lower magnitude negative signal is not adequate for the higher voltage positive signal. Previously erased or crosstalk positive signal data picked up by the magneto resistive head may have a magnitude large enough to produce a false data read using the low threshold voltage. This problem of false readings would be further exacerbated when power supply noise is added to the system. It would be of great benefit if a sensing circuit could be produced for detecting asymmetrical data produced by a magneto resistive head without errors due to false readings or power supply noise problems.

SUMMARY OF THE INVENTION

Briefly stated, this invention comprises a data qualification circuit for sensing a logic state of a differential input voltage. The data qualification circuit comprises a comparator, a first threshold circuit, and a second threshold circuit. The comparator includes a first input, a second input, and an output.

The first threshold circuit includes a first input, a second input, a control input coupled to the output of the comparator, a first output coupled to the first input of the comparator, and a second output coupled to the second input of the comparator. A zero logic state at the output of the comparator enables the first threshold circuit for providing a first offset voltage across the first and second inputs of the comparator. The first offset voltage sets a one logic state threshold voltage. The first offset voltage is summed with the differential input voltage for amplification by the comparator.

The second threshold circuit includes a first input, a second input, a control input coupled to the output of the comparator, a first output coupled to the second input of the comparator, and a second output coupled to the first input of the comparator. A one logic state at the output of the comparator enables the second threshold circuit for providing a second offset voltage across the first and second input of the comparator. The second offset voltage sets a zero logic state threshold voltage. The second offset voltage is summed with the differential input voltage for amplification by the comparator.

DETAILED DESCRIPTION OF THE DRAWINGS

Figure 1:
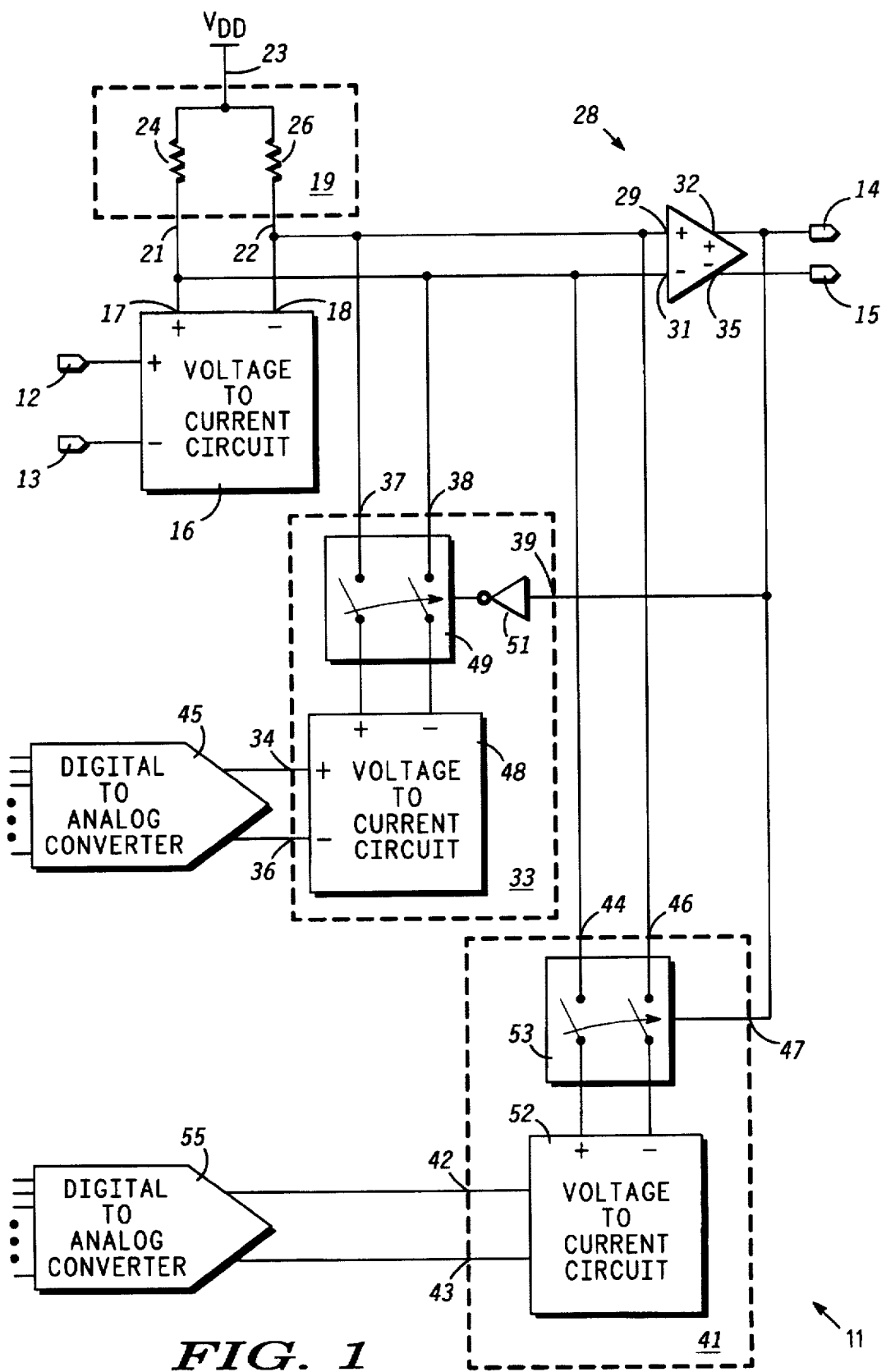
FIG. 1 is a block diagram of a full differential data qualification circuit 11 in accordance with the present invention.

FIG. 1 is a block diagram of a full differential data qualification circuit 11 in accordance with the present invention.

A magneto resistive head for sensing data stored on a magnetic media is an example of a sense circuit that outputs an asymmetrical differential signal for positive versus negative polarization's stored on the magnetic media. For example, a positive signal output by the magneto resistive head and amplifier might have a peak magnitude of one volt while a negative signal output might have a peak magnitude of 0.5 volts. A circuit such as data qualification circuit 11 translates the asymmetrical differential signal to more conventional digital output signal magnitudes used by complementary metallic oxide semiconductor (CMOS) circuits or transistor transistor logic (TTL) circuits, both well known in the industry.

Several problems must be addressed by data qualification circuit 11. First, the data received arrives at extremely high speeds, for example, positive signal peak transitioning to a negative signal peak and back to a positive signal peak can occur in approximately 20 nanoseconds. The circuitry must be extremely fast to respond to the data. In the preferred embodiment, current summing is employed within data qualification circuit 11 to minimize voltage swings and increase data sensing speed. Second, power supply noise can produce errors in data by producing false one or zero logic states. Full differential circuitry is used throughout data qualification circuit 11 to common mode power supply noise. Third, erasing the magnetic media does not completely remove old information, erased data is reduced in magnitude but still sensed by the sensing circuit. Also, a magnetic media such as a magnetic storage disk has data stored in tracks. The sensing circuit can pick up data from adjacent tracks. It is essential that data qualification circuit 11 does not produce false one or zero logic states from either the residual signals or through crosstalk from other data. This problem is alleviated by sensing data having a magnitude greater than a predetermined threshold voltage. The residual signals and crosstalk from other data that is sensed by data qualification circuit 11 is below this predetermined threshold voltage. Fourth, because the data is asymmetrical the optimum threshold voltage will be different for the positive signals or the negative signals. Data qualification circuit 11 has circuitry for setting the positive and negative thresholds independently from one another. Finally, noise, residual signals, and crosstalk will vary from system to system. Data qualification circuit 11 has adjustable positive and negative thresholds to allow systems to be individually optimized.

Data qualification circuit 11 has an input 12, an input 13, an output 14, and an output 15. A differential input signal is applied to inputs 12 and 13 and is translated by data qualification circuit 11 to produce a corresponding logic state at outputs 14 and 15. Data qualification circuit 11 is shown having a differential output for high speed applications. Outputs 14 and 15 would be used to couple to circuitry such as current mode logic (CML). This does not preclude the use of a single output that produces a standard TTL (transistor transistor logic) or CMOS (complementary metallic oxide semiconductors) logic state.

In the preferred embodiment, a voltage to current circuit 16 is used to convert the differential input signal to a differential current. Voltage to current circuit 16 includes an input coupled to input 12, an input coupled to input 13, an output 17, and an output 18. A load circuit 19 is used for summing currents. Load circuit 19 has a terminal 21 coupled to output 17 of voltage to current circuit 16, a terminal 22 coupled to output 18 of voltage to current circuit 16, and a terminal 23 coupled to a terminal of a power supply Vdd. In the preferred embodiment, load circuit 19 comprises a resistor 24 and a resistor 26. Resistor 24 includes a terminal coupled to terminal 23 and a terminal coupled to terminal 21 of load circuit 19. Resistor 26 includes a terminal coupled to terminal 23 and a terminal coupled to terminal 22 of load circuit 19. A comparator 28 amplifies the voltage difference between terminals 21 and 22 of load circuit 19. Comparator 28 includes an input 29 coupled to terminal 22 of load circuit 19, an input 31 coupled to terminal 21 of load circuit 19, an output 32 coupled to output 14, and an output 35 coupled to output 15.

As shown in FIG. 1, input 29 is the positive input of comparator 28 and input 31 is the negative input of comparator 28. A positive differential voltage across terminals 22 and 21 of load circuit 19 generates a one logic state at output 32 of comparator 28 and a zero logic state at output 35. A negative differential voltage across terminals 22 and 21 of load circuit 19 generates a zero logic state at output 32 and a one logic state at output 35. Output 35 provides the complement of output 32, hereinafter only the logic state provided at output 32 will be discussed and it should be assumed that output 35 provides a complementary logic state with approximately equal delay times.

A threshold circuit 33 generates a one logic state threshold voltage. Threshold circuit 33 includes an input 34, an input 36, a control input 39 coupled to output 32 of comparator 28, an output 37 coupled to terminal 22 of load circuit 19, and an output 38 coupled to terminal 21 of load circuit 19. Inputs 34 and 36 receive a one logic state reference voltage for producing an offset voltage. In the preferred embodiment, a digital to analog converter 45 provides the one logic state reference voltage. Digital to analog converters are well known by one skilled in the art. Digital to analog converter 45 includes a plurality of inputs for programming the one logic state reference voltage, an output coupled to input 34 of threshold circuit 33, and an output coupled to input 36 of threshold circuit 33. Control input 39 enables threshold circuit 33 for applying the offset voltage across inputs 29 and 31 of comparator 28. In the preferred embodiment, threshold circuit 33 is enabled when output 32 of comparator 28 is at the zero logic state. Data qualification circuit 11 is then in a mode for sensing the one logic state. if the one logic state is not sensed by circuit 11, output 32 remains in the zero logic state. Comparator 28 generates the one logic state when the input differential signal and the offset voltage combine to produce a positive voltage across inputs 29 and 31.

In the preferred embodiment, threshold circuit 33 generates an offset differential current to produce the offset voltage. The offset differential current from threshold circuit 33 is summed with the differential current produced by voltage to current circuit 16. The resultant currents produce a voltage at terminals 22 and 21 of load circuit 19, the difference voltage of terminals 22 and 21 being applied across terminals 29 and 31 of comparator 28.

Threshold circuit 33 comprises a voltage to current circuit 48, a switch circuit 49, and an inverter 51. Voltage to current circuit 48 includes an input coupled to input 34 of threshold circuit 33, an input coupled to input 36 of threshold circuit 33, a first output, and a second output. Inputs 34 and 36 receive the one logic state reference voltage and voltage to current circuit 48 generates the differential current corresponding to the one logic state reference voltage at the first and second outputs. Switch circuit 49 includes an input coupled to the first output of voltage to current circuit 48, an input coupled to the second output of voltage to current circuit 48, a control input, an output coupled to output 37 of threshold circuit 33, and an output coupled to output 38 of threshold circuit 33. Switch circuit 49 couples the differential current generated by voltage to current circuit 48 to terminals 21 and 22 of load circuit 19. Inverter 51 includes an input coupled to control input 39 of threshold circuit 33 and an output coupled to the control input of switch circuit 49. In the preferred embodiment, a zero logic state at output 32 of comparator 28 produces a one logic state at the output of inverter 51, the one logic state enables switch circuit 49 for coupling voltage to current circuit 48 to terminals 21 and 22 of load circuit 19.

A threshold circuit 41 generates a zero logic state threshold voltage. Threshold circuit 41 operates similar to threshold circuit 33 but produces the opposite result. Threshold circuit 41 includes an input 42, an input 43, a control input 47 coupled to output 32 of comparator 28, an output 44 coupled to terminal 21 of load circuit 19, and an output 46 coupled to terminal 22 of load circuit 19. Inputs 42 and 43 receive a zero logic state reference voltage for producing an offset voltage. In the preferred embodiment, a digital to analog converter 55 provides the zero logic state reference voltage. Digital to analog converter 55 includes a plurality of inputs for programming the zero logic state reference voltage, an output coupled to input 42 of threshold circuit 41, and an output coupled to input 43 of threshold circuit 41. Control input 47 enables threshold circuit 41 for applying the offset voltage across inputs 29 and 31 of comparator 28. In the preferred embodiment, threshold circuit 41 is enabled when output 32 of comparator 28 is at the one logic state. Data qualification circuit 11 is then in a mode for sensing the zero logic state. if the zero logic state is not sensed by circuit 11, output 32 remains in the one logic state. Comparator 28 generates the zero logic state when the input differential signal and the offset voltage combine to produce a negative voltage across inputs 29 and 31.

In the preferred embodiment, threshold circuit 41 generates an offset differential current to produce the offset voltage. The offset differential current from threshold circuit 41 is summed with the differential current produced by voltage to current circuit 16. The resultant currents produce a voltage at terminals 22 and 21 of load circuit 19, the difference voltage of terminals 22 and 21 being applied across terminals 29 and 31 of comparator 28.

Threshold circuit 41 comprises a voltage to current circuit 52 and a switch circuit 53. Voltage to current circuit 52 includes an input coupled to input 42 of threshold circuit 41, an input coupled to input 43 of threshold circuit 41, a first output, and a second output. Inputs 42 and 43 receive the zero logic state reference voltage and voltage to current circuit 52 generates the differential current corresponding to the zero logic state reference voltage at the first and second outputs. Switch circuit 53 includes an input coupled to the first output of voltage to current circuit 52, an input coupled to the second output of voltage to current circuit 52, a control input coupled to the control input 47, an output coupled to output 44 of threshold circuit 41, and an output coupled to output 46 of threshold circuit 41. Switch circuit 53 couples the differential current generated by voltage to current circuit 52 to terminals 21 and 22 of load circuit 19. In the preferred embodiment, a one logic state at output 32 of comparator 28 enables switch circuit 53 for coupling voltage to current circuit 52 to terminals 21 and 22 of load circuit 19.

Figure 2:
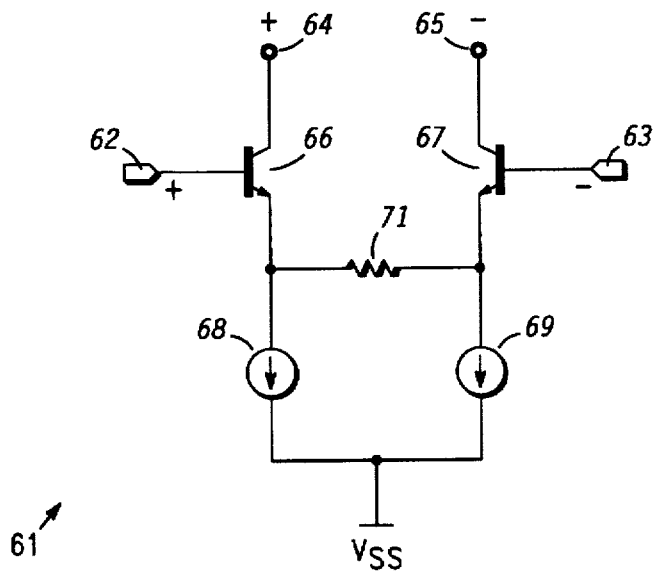
FIG. 2 is a schematic of a voltage to current circuit in accordance with the present invention.

FIG. 2 is a schematic of a voltage to current circuit 61 in accordance with the present invention. Voltage to current circuit 61 is one embodiment of a voltage to current circuit that can be used in data qualification circuit 11 of FIG. 1. Voltage to current circuit 61 provides a differential current corresponding to an input differential voltage.

Voltage to current circuit 61 includes an input 62, an input 63, an output 64, and an output 65. Voltage to current circuit 61 comprises a transistor 66, a transistor 67, a resistor 71, a current source 68, and a current source 69. Transistor 66 includes a base corresponding to a control input coupled to input 62, a collector corresponding to a first terminal coupled to output 64, and an emitter corresponding to a second terminal. Transistor 67 includes a base corresponding to a control input coupled to input 63, a collector corresponding to a first terminal coupled to output 65, and an emitter corresponding to a second terminal. Resistor 71 is coupled between the emitters of transistors 66 and 67. Current source 68 includes a terminal coupled to the emitter of transistor 66 and a terminal coupled to a terminal of a power supply Vss. Current source 69 includes a terminal coupled to the emitter of transistor 67 and a terminal coupled to the terminal of power supply Vss.

In the preferred embodiment the currents supplied by current sources 68 and 69 are identical. A voltage difference across inputs 62 and 63 generates a difference current at outputs 64 and 65. The voltage to current response of voltage to current circuit 61 is linear. For example, current sources 68 and 69 each output a current I and resistor 71 has a resistance R. No current flows through resistor 71 when inputs 62 and 63 are at identical voltages since transistors 66 and 67 are biased identically. A sink current equal to I is generated at outputs 64 and 65. A positive voltage V from input 62 to input 63 increases the bias on transistor 66 and reduces the bias on transistor 67. A sink current of approximately I+V/R is generated at output 64 and a sink current of approximately I−V/R is generated at output 65. If the positive voltage V were doubled to 2V the resultant change in current would respond linearly, thus I+V/R would change to I+2V/R and I−V/R would change to I−2V/R. A negative voltage V from input 62 to input 63 produces the opposite results. A sink current of approximately I−V/R is generated at output 64 and a sink current of approximately I+V/R is generated at output 65.

Referring back to FIG. 1, the operation of data qualification circuit 11 and the setting of the one and zero logic state thresholds is best described by providing example currents to threshold circuits 33 and 41. Assume resistors 24 and 26 of load circuit 19 each have a resistance R and that the one logic state threshold voltage is 1 volt and the zero logic state threshold voltage is 0.50 volt. Under quiescent conditions (inputs 12 and 13 at equal voltages) voltage to current circuit 16 will sink 100 micro amperes (ua) at outputs 17 and 18. Voltage to current circuit 16, for example, may then be set (adjusting resistor 71 of FIG. 2) to sink 150 micro amperes at output 17 and 50 micro amperes at output 18 when a positive 1 volt differential signal is applied across inputs 12 and 13. Conversely, a negative 0.50 volt differential voltage across inputs 12 and 13 will cause voltage to current circuit 16 to sink 75 micro amperes at output 17 and 125 micro amperes at output 18. For brevity, only output 14 is analyzed, it should be assumed that output 15 provides the complement of the logic state at output 14.

Example #1, output 14 is at a zero logic state and threshold circuit 33 is enabled (threshold circuit 41 is disabled). Threshold circuit 33 is set to sink 150 micro amperes at output 37 and 50 micro amperes at output 38. Under quiescent conditions (inputs 12 and 13 at equal voltage) the differential current output by threshold circuit 33 produces a negative differential voltage across inputs 29 and 31 of comparator 28. The negative differential voltage generates the zero logic state at output 14. Equations 1-3 illustrate the negative differential voltage across inputs 29 and 31 under quiescent conditions.

$$V(input\ 29) = (Vdd - (100ua + 150ua) * R) \qquad (1)$$

$$V(input\ 31) = (Vdd - (100ua + 50ua) * R) \qquad (2)$$

$$Vdiff1 = (V(input\ 29) - V(input\ 31)) = -100ua * R \qquad (3)$$

A positive differential voltage across inputs 12 and 13 increases sink current at output 17 and decreases sink current at output 18. The positive differential voltage increases Vdiff1 of equation 3 above. When the positive differential voltage is 1 volt across inputs 12 and 13 (equations 4–6) there is no voltage difference across inputs 29 and 31 of comparator 28. Thus threshold circuit 33 generates a 1 volt threshold voltage.

$$V(input\ 29) = (Vdd - (50ua + 150ua) * R) \qquad (4)$$

$$V(input\ 31) = (Vdd - (150ua + 50ua) * R) \qquad (5)$$

$$Vdiff1 = (V(input\ 29) - V(input\ 31)) = 0 \qquad (6)$$

Further increasing the differential voltage across inputs 12 and 13 greater than 1 volt generates a positive voltage (equations 7–9) across inputs 29 and 31 of comparator 28. The current dI is the increase or decrease in current at outputs 17 and 18 due to the increase in the differential voltage greater than one volt.

$$V(input\ 29) = (Vdd - ((50 - dI)ua + 150ua) * R) \qquad (7)$$

$$V(input\ 31) = (Vdd - ((150 + dI)ua + 50ua) * R) \qquad (8)$$

$$Vdiff1 = (V(input\ 29) - V(input\ 31)) = 2 * dI * R \qquad (9)$$

Assuming an infinite or high gain for comparator 28, a positive voltage of 2*dI*R across inputs 29 and 31 of comparator 28 will generate a one logic state at output 14. Thus the one logic state is sensed when the differential voltage across inputs 12 and 13 exceed one volt.

Example #2, output 14 is at a one logic state and threshold circuit 41 is enabled (threshold circuit 33 is disabled). Threshold circuit 41 is set to sink 125 micro amperes at output 44 and 75 micro amperes at output 46. Under quiescent conditions (inputs 12 and 13 at equal voltage) the differential current output by threshold circuit 41 produces a positive voltage across inputs 29 and 31 of comparator 28. The positive voltage generates the one logic state at output 14. Equations 10–12 illustrate the positive differential voltage across inputs 29 and 31 under quiescent conditions.

$$V(input\ 29) = (Vdd - (100ua + 75ua)*R) \quad (10)$$

$$V(input\ 31) = (Vdd - (100ua + 125ua)*R) \quad (11)$$

$$Vdiff2 = (V(input\ 29) - V(input\ 31)) = 50ua*R \quad (12)$$

A negative differential voltage across inputs 12 and 13 decreases sink current at output 17 and increases sink current at output 18. The negative differential voltage decreases Vdiff2 of equation 12 above. When the negative differential voltage is 0.50 volt across inputs 12 and 13 (equations 13–15) there is no voltage difference across inputs 29 and 31 of comparator 28. Thus threshold circuit 41 generates a 0.50 volt threshold voltage.

$$V(input\ 29) = (Vdd - (125ua + 75ua)*R) \quad (13)$$

$$V(input\ 31) = (Vdd - (75ua + 125ua)*R) \quad (14)$$

$$Vdiff2 = (V(input\ 29) - V(input\ 31)) = 0 \quad (15)$$

Further increasing the negative differential voltage across inputs 12 and 13 greater than –0.50 volt generates a negative voltage (equations 16–18) across inputs 29 and 31 of comparator 28. The current dI is the increase or decrease in current at outputs 17 and 18 due to the increase in the negative differential voltage less than 0.50 volt.

$$V(input\ 29) = (Vdd - ((125 + dI)ua + 75ua)*R) \quad (16)$$

$$V(input\ 31) = (Vdd - ((75 - dI)ua + 125ua)*R) \quad (17)$$

$$Vdiff = (V(input\ 29) - V(input\ 31)) = 2*dI*R \quad (18)$$

Assuming the high gain for comparator 28, a negative voltage of –2*dI*R across inputs 29 and 31 of comparator 28 will generate a zero logic state at output 14. Thus the zero logic state is sensed when the differential voltage across inputs 12 and 13 are less than –0.50 volt. The zero logic state at output 14 disables threshold circuit 41 and enables threshold circuit 33. Data qualification circuit 11 is once again set for sensing the one logic state.

Figure 3:
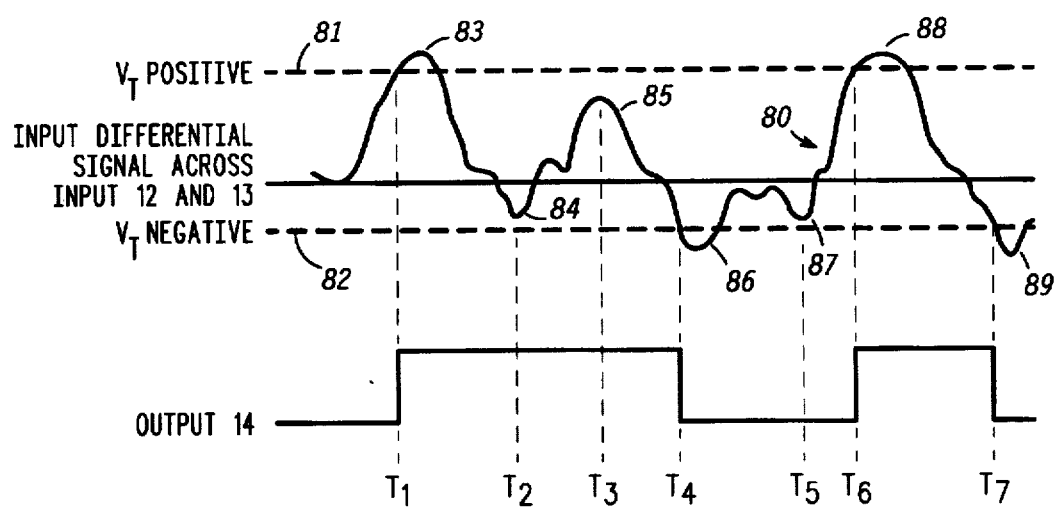
FIG. 3 is a timing diagram corresponding to the circuitry of FIG. 1.

FIG. 3 is a timing diagram corresponding to the circuitry of FIG. 1. Assume input differential voltage signal 80 is applied across inputs 12 and 13 of data qualification circuit 11 (FIG. 1). Input differential voltage signal 80 is shown having positive peaks 83, 85, and 88 and negative peaks 84, 86, 87, and 89. A positive threshold voltage is illustrated by dotted line 81. A negative threshold voltage is illustrated by dotted line 82. In this example, the positive threshold voltage has a larger voltage magnitude than the negative threshold voltage. It should be noted that the positive and negative threshold voltages are independently adjusted for the application.

Output 14 of data qualification circuit is also shown (output 15 providing the complement of output 14). Prior to peak 83, output 14 is in a zero logic state thereby enabling threshold circuit 33 for coupling to load circuit 19. Threshold circuit 33 produces an offset voltage equal to the positive threshold voltage of dotted line 81. When the differential input signal is greater than the positive threshold voltage, a positive voltage is generated across inputs 29 and 31 of comparator 28. Comparator 28 amplifies this positive voltage to generate a one logic state at output 32. This is illustrated at time $T_1$ by the positive transition to the one logic state of output 14.

The one logic state at output 14 disables threshold circuit 33 and enables threshold circuit 41 for coupling to load circuit 19. Threshold circuit 41 thus produces an offset voltage equal to the negative threshold voltage of dotted line 82. Peak 84 of the input differential voltage, although negative is not below the negative threshold voltage and thus does not generate a negative voltage across inputs 29 and 31 of comparator 28 at time $T_2$. A positive transition, such as peak 85 at time $T_3$, does not change the output status of comparator 28 since it is already in the one logic state (as indicated by output 14).

The input differential voltage at peak 86 occurring at time $T_4$ does, however, transition below the negative threshold voltage. A negative voltage is then generated across inputs 29 and 31 of comparator 28. Comparator 28 amplifies this negative voltage to generate a zero logic state at output 32. This is illustrated by the negative transition to the zero logic state at output 14.

The input differential voltage at peak 87 ($T_5$) is less than the negative threshold voltage. Peak 87 does not change the status of output 14 since it is already in the zero logic state.

Similar to peak 83, peak 88 ($T_6$) is greater than the positive threshold voltage and produces a one logic state at output 32 of comparator 28. This is illustrated by the positive transition of output 14.

Similar to peak 86, peak 89 is below the negative threshold voltage and produces a zero logic state at output 32 of comparator 28. This is illustrated by the negative transition of output 14.

By now it should be appreciated that a data qualification circuit has been described. The data qualification circuit provides independent setting of a one logic state threshold and a zero logic state threshold and is fully differential to common mode noise.

I claim:

1. A data qualification circuit for translating an applied differential input voltage to an output signal having first or second predetermined level logic states, comprising:

a comparator having first and second inputs and at least one output at which the output signal is provided;

a first threshold circuit responsive to the output signal being at the second logic level state for providing a first threshold level signal across said first and second inputs of said comparator, said first threshold circuit being programmable to adjust a magnitude of said first threshold level signal;

a second threshold circuit responsive to the output signal being at the first logic level state for providing a second threshold level signal across said first and second inputs of said comparator, said second threshold circuit being programmable to adjust a magnitude of said second threshold level signal; and an input circuit responsive to the differential input voltage for providing an output signal across said first and second inputs of said comparator, said first and second threshold level signals being summed with said output signal of said input circuit as said first and second threshold circuits are rendered operative in response to said output signal from said comparator.

2. A data qualification circuit as recited in claim 1 wherein said first and second threshold levels signals have different signal magnitudes.

3. A data qualification circuit as recited in claim 1 further including a load circuit for summing signals applied to said first and second inputs of said comparator, said load circuit including a first and a second terminal coupled respectively to said first and second inputs of said comparator.

4. A data qualification circuit as recited in claim 3 wherein said load circuit comprises:
- a first resistor including a terminal coupled to a terminal of a power supply and a second terminal corresponding to said first terminal of said load circuit; and
- a second resistor including a terminal coupled to said terminal of said power supply and a second terminal corresponding to said second terminal of said load circuit.

5. A data qualification circuit as recited in claim 3 wherein said input circuit comprises a voltage to current circuit responsive to the applied input differential voltage and providing a differential current to said load circuit.

6. A data qualification circuit as recited in claim 3 wherein said first threshold circuit comprises:
- a voltage to current circuit responsive to an applied reference voltage and providing a differential current corresponding to said first reference voltage; and
- a switch circuit responsive to the output signal being in the second logic state, said switch circuit coupling said voltage to current circuit to said load circuit.

7. A data qualification circuit as recited in claim 6 further including a digital to analog converter for providing said applied reference voltage, said digital to analog converter being programmable for changing said applied reference voltage.

8. A data qualification circuit as recited in claim 3 wherein said second threshold circuit comprises:
- a voltage to current circuit responsive to an applied reference voltage and providing a differential current corresponding to said second reference voltage; and
- a switch circuit responsive to the output signal being in the first logic state, said switch circuit coupling said voltage to current circuit to said load circuit.

9. A data qualification circuit as recited in claim 8 further including a digital to analog converter for providing said applied reference voltage, said digital to analog converter being programmable for changing said applied reference voltage.

10. A circuit for translating an applied differential input voltage to an output signal having first or second predetermined level logic states, comprising:
- a comparator having first and second inputs and at least one output at which the output signal is provided;
- a load circuit for summing signals applied thereto, said load circuit having a first terminal coupled to said first input of said comparator and a second terminal coupled to said second input of said comparator;
- a first threshold circuit responsive to the output signal being at the second logic level state for providing a first threshold level signal across said first and second terminals of said load circuit, said first threshold circuit being programmable to adjust a magnitude of said first threshold level signal;
- a second threshold circuit responsive to the output signal being at the first logic level state for providing a second threshold level signal across said first and second terminals of said load circuit, said second threshold circuit being programmable to adjust a magnitude of said second threshold level signal; and
- an input circuit responsive to the differential input voltage for providing an output signal across said first and second terminals of said load circuit, said first and second threshold level signals being summed with said output signal of said input circuit as said first and second threshold circuits are rendered operative in response to said output signal from said comparator.

11. A circuit as recited in claim 10 wherein said load circuit comprises a first resistor including a first terminal coupled to a terminal of a power supply and a second terminal corresponding to said first terminal of said load circuit and a second resistor including a first terminal coupled to said terminal of said power supply and a second terminal corresponding to said second terminal of said load circuit, and wherein said input circuit, first threshold circuit, and second threshold circuit each provide a differential current signal corresponding respectively to said output signal of said input circuit, said first threshold level signal, and said second threshold level signal.

12. A circuit as recited in claim 11 wherein said input circuit comprises a voltage to current circuit responsive to said applied differential voltage and providing said differential current signal to said load circuit, said voltage to current circuit comprising:
- a first transistor including a control terminal coupled to a first input, a first terminal coupled to said first terminal of said load circuit, and a second terminal;
- a second transistor including a control terminal coupled to a second input, a first terminal coupled to said second terminal of said load circuit, and a second terminal, said first and second inputs receiving said differential input voltage;
- a resistor coupled between said second terminal of said first transistor and said second terminal of said second transistor;
- a first current source for biasing said first transistor including a terminal coupled to said second terminal of said first transistor; and
- a second current source for biasing said second transistor including a terminal coupled to said second terminal of said second transistor.

13. A circuit for translating an applied differential input voltage to an output signal having first or second predetermined level logic states, comprising:
- a comparator having first and second inputs and at least one output at which the output signal is provided;
- a load circuit for summing signals applied thereto, said load circuit having a first terminal coupled to said first input of said comparator and a second terminal coupled to said second input of said comparator, said load circuit comprises a first resistor including a first terminal coupled to a terminal of a power supply and a second terminal corresponding to said first terminal of said load circuit and a second resistor including a first terminal coupled to said terminal of said power supply and a second terminal corresponding to said second terminal of said load circuit;
- a first threshold circuit responsive to the output signal being at the second logic level state for providing a first threshold level signal across said first and second terminals of said load circuit, said first threshold circuit comprises a switch circuit responsive to the output signal being at the second logic level, said switch circuit including a first input, a second input, a first output coupled to said first terminal of said load circuit, and a second output coupled to said second terminal of said load circuit;

a voltage to current circuit responsive to an applied reference voltage and providing said differential current signal to said load circuit when coupled thereto by said switch circuit, said voltage to current circuit comprising:

a first transistor including a control terminal coupled to a first input of said first threshold circuit, a first terminal coupled to said first input of said switch circuit, and a second terminal;

a second transistor including a control terminal coupled to a second input of said first threshold circuit, a first terminal coupled to said second input of said switch circuit, and a second terminal, said first and second inputs of said first threshold circuit receiving said applied reference voltage;

a resistor coupled between said second terminal of said first transistor and said second terminal of said second transistor;

a first current source for biasing said first transistor including a terminal coupled to said second terminal of said first transistor;

a second current source for biasing said second transistor including a terminal coupled to said second terminal of said second transistor;

a second threshold circuit responsive to the output signal being at the first logic level state for providing a second threshold level signal across said first and second terminals of said load circuit; and an input circuit responsive to the differential input voltage for providing an output signal across said first and second terminals of said load circuit, said first and second threshold level signals being summed with said output signal of said input circuit as said first and second threshold circuits are rendered operative in response to said output signal from said comparator;

wherein said input circuit, first threshold circuit, and second threshold circuit each provide a differential current signal corresponding respectively to said output signal of said input circuit, said first threshold level signal, and said second threshold level signal.

14. A circuit as recited in claim 13 wherein a digital to analog converter provides said applied reference voltage to said first and second inputs of said first threshold circuit.

15. A circuit as recited in claim 13 wherein said second threshold circuit comprises:

a switch circuit responsive to the output signal being at the first logic level, said switch circuit including a first input, a second input, a first output coupled to said second terminal of said load circuit, and a second output coupled to said first terminal of said load circuit;

a voltage to current circuit responsive to an applied reference voltage and providing said differential current signal to said load circuit when coupled thereto by said switch circuit, said voltage to current circuit comprising:

a first transistor including a control terminal coupled to a first input of said second threshold circuit, a first terminal coupled to said first input of said switch circuit, and a second terminal;

a second transistor including a control terminal coupled to a second input of said second threshold circuit, a first terminal coupled to said second input of said switch circuit, and a second terminal, said first and second inputs of said second threshold circuit receiving said applied reference voltage;

a resistor coupled between said second terminal of said first transistor and said second terminal of said second transistor;

a first current source for biasing said first transistor including a terminal coupled to said second terminal of said first transistor; and a second current source for biasing said second transistor including a terminal coupled to said second terminal of said second transistor.

16. A circuit as recited in claim 15 wherein a digital to analog converter provides said applied reference voltage to said first and second inputs of said second threshold circuit.

17. A full differential data qualification circuit for translating an applied differential input voltage to an output signal having first or second predetermined logic level states, the full differential data qualification circuit comprising:

a comparator including a first input, a second input, and at least one output at which the output signal is provided;

a first threshold circuit for providing a first threshold level signal across said first and second inputs of said comparator, said first threshold circuit including a first input, a second input, a control input coupled to said output of said comparator, a first output coupled to said first input of said comparator, and a second output coupled to said second input of said comparator, said first and second inputs of said first threshold circuit being responsive to an applied first reference voltage, said first and second outputs providing said first threshold level signal when rendered operative by the output signal being in the second predetermined logic level state, said first threshold circuit being programmable to adjust a magnitude of said first threshold level signal;

a second threshold circuit for providing a second threshold level signal across said first and second inputs of said comparator, said second threshold circuit including a first input, a second input, a control input coupled to said output of said comparator, a first output coupled to said second input of said comparator, and a second output coupled to said first input of said comparator, said first and second inputs of said second threshold circuit being responsive to an applied second reference voltage,. said first and second outputs providing said second threshold level signal when rendered operative by the output signal being in the first predetermined logic level state, said second threshold circuit being programmable to adjust a magnitude of said second threshold level signal; and an input circuit for providing an output signal across said first and second inputs of said comparator, said input circuit including a first input, a second input, a first output coupled to said first input of said comparator, and a second input coupled to said second input of said comparator, said first and second inputs receiving the applied differential input voltage.

18. A full data qualification circuit as recited in claim 17 wherein a first digital to analog converter provides said first reference voltage, wherein a second digital to analog converter provides said second reference voltage thereby allowing said first and second threshold signals to be of different magnitudes.

19. A full data qualification circuit as recited in claim 17 further including a load circuit for summing signals provided by said input circuit, said first threshold circuit, and said second threshold circuit, said load circuit comprising a first resistor including a first terminal coupled to a terminal of a power supply and a second terminal coupled to said first input of said comparator, and a second resistor including a first terminal coupled to said terminal of said power supply and a second terminal coupled to said second input of said comparator.

20. A full data qualification circuit as recited in claim 19 wherein the applied differential input voltage is converted to a differential current by said input circuit and either said first threshold circuit or second threshold circuit rendered operative by the output signal provides a differential current.

* * * * *